US006737735B2

(12) United States Patent
Ito (10) Patent No.: US 6,737,735 B2
(45) Date of Patent: May 18, 2004

(54) SEMICONDUCTOR DEVICE WIRING LEAD FRAME HAVING RESIN FLOW CONTROL PLATES (75) Inventor: Takahiro Ito, Kumamoto (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/373,110

(22) Filed: Feb. 26, 2003

(65) Prior Publication Data
US 2003/0160308 A1 Aug. 28, 2003

(30) Foreign Application Priority Data
Feb. 27, 2002 (JP) ........................................ 2002-051418

(51) Int. Cl.⁷ ............................................. H01L 23/495
(52) U.S. Cl. ........................................ 257/667; 257/666
(58) Field of Search ................................. 257/667, 666

(56) References Cited

U.S. PATENT DOCUMENTS
5,614,760 A * 3/1997 Osono et al. ................ 257/668

FOREIGN PATENT DOCUMENTS
JP    5-152501 A    6/1993
JP    405211190    * 8/1993
JP    10-340976 A    12/1998

* cited by examiner

Primary Examiner—David Nelms
Assistant Examiner—Tu-Tu Ho
(74) Attorney, Agent, or Firm—Sughrue Mion, PLLC

(57) ABSTRACT

A semiconductor device of the present invention has an island; a semiconductor pellet fixed onto the island; many inner leads extended to the island; a resin sealing the island, semiconductor pellet and inner leads; and resin flow control plates provided between the edges of the inner leads and the island.

19 Claims, 9 Drawing Sheets

SEMICONDUCTOR DEVICE WIRING LEAD FRAME HAVING RESIN FLOW CONTROL PLATES

BACKGROUND OF THE INVENTION

1. Field of the Invention

The present invention relates to a semiconductor device. More specifically, the present invention relates to a semiconductor device of a resin sealing type having more pins and a smaller semiconductor pellet.

2. Description of the Prior Art

A semiconductor device has a large space between the edges of inner leads and an island due to a request for more pins of a PKG and a smaller semiconductor pellet.

Figure 7A:
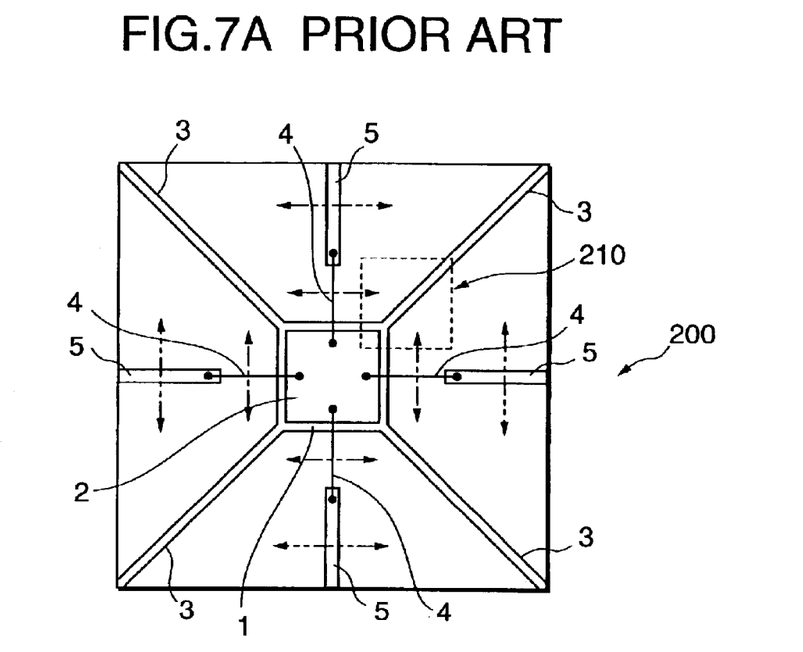
FIG. 7A is a plan view and FIG. 7B is a plan view enlarging a part 210 of FIG. 7A.
Figure 7B:
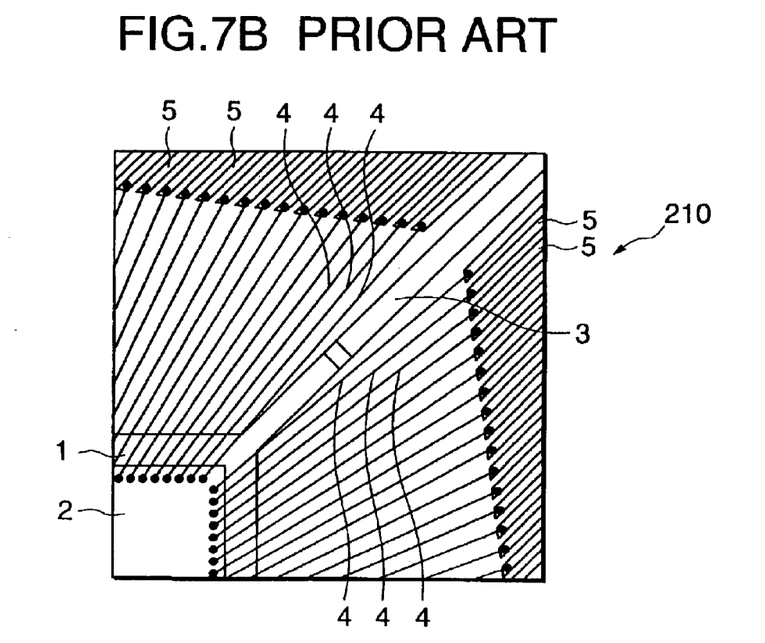

FIG. 7 is a diagram showing a prior art semiconductor device in the state that a semiconductor pellet is fixed onto a lead frame and the electrodes of the semiconductor pellet and the edge parts of inner leads are connected by bonding wires in which FIG. 7A is a plan view and FIG. 7B is an enlarged plan view enlarging a part 210 indicated by the dotted line of FIG. 7A. Other three hanger leads and their peripheral parts have the same structure.

In FIG. 7, an island 1 fixing and mounting a semiconductor pellet 2 is supported by four hanger leads 3. Inner leads 5 of a lead frame 200 are extended in the island direction. As indicated by the phantom line arrows, the many inner leads 5 are arrayed at a fixed pitch at each side of the island 1 and surround the island 1. The edge parts of all the inner leads 5 and the electrodes of the semiconductor pellet 2 are connected by bonding wires 4. As indicated by the phantom line arrows, the arrayed bonding wires 4 also surround the island 1.

Figure 8A:
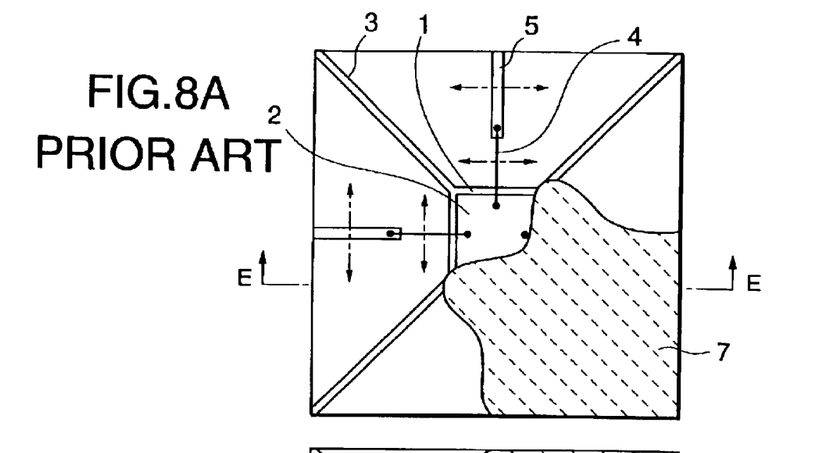
FIGS. 8A–8C are plan views sequentially showing a resin flow in the prior art.
Figure 8B:
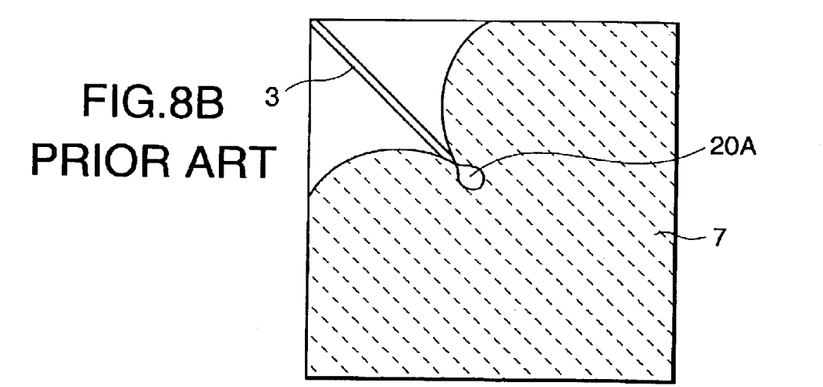
Figure 8C:
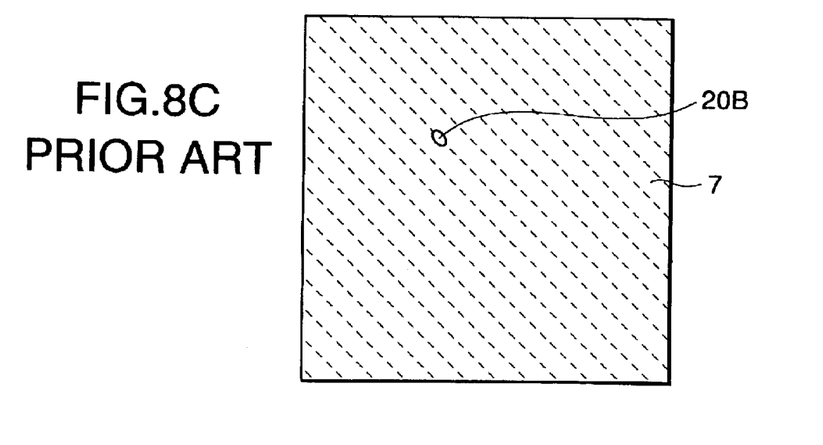
Figure 9:
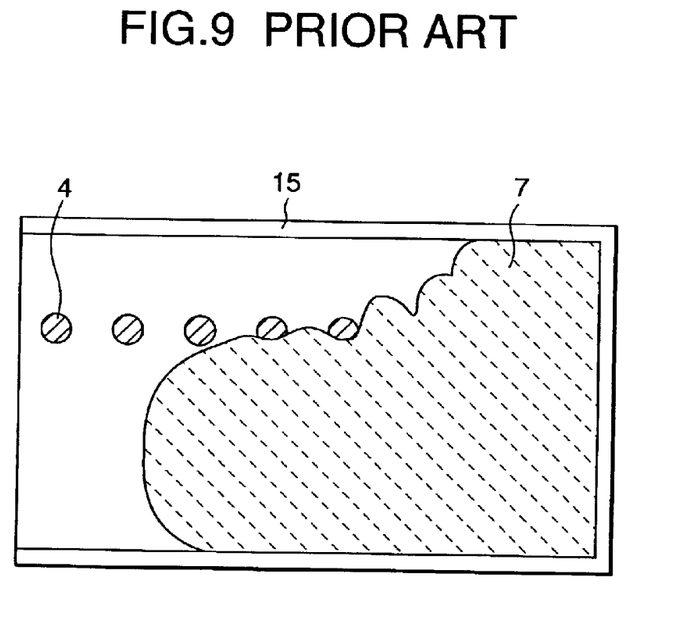
FIG. 9 is a cross-sectional view enlarging E—E part of FIG. 8A.

FIG. 8 is a plan view sequentially showing a resin flow in the prior art when the assembly in the state of FIG. 7 is sealed by a resin 7. FIG. 9 is a cross-sectional view enlarging E—E part of FIG. 8A.

Generally, a resin is filled first into a larger filling part. As shown in FIG. 8A, in the case of the shape of the lead frame of FIG. 7, a resin is filled first between the lead edges and the island (pellet mounting part). The resin is filled first into this part, and is then filled into the top/bottom surfaces of the pellet. The resin is filled into the peripheral part before being filled into the pellet. An air bubble 20A occurs on the top surface of the chip (FIG. 8B). At the completion of the filling, a void (bubble) 20B occurs without crushing the air bubble. The resin is hardened while the void exists. The semiconductor device has an insulation problem (FIG. 8C).

In the prior art, the resin is filled first into the larger part. As shown in FIG. 9, the resin 7 is filled first into the bottom surface side of the bonding wires 4 in a mold 15. To eliminate the filling difference, the resin 7 moves the bonding wires 4 upward to push away the bonding wires 4. At the movement, wire deformation, that is, undesired movement of the bonding wires occurs.

In the prior art, the resin filling difference between the top surface of the smaller semiconductor pellet with the thinner PKG and the inner lead edges-island is larger. A void (crack and gap) can be easily produced. The wire deformation due to the long wire can easily occur.

In the prior art, due to the thinner PKG, the filling difference between the chip and the chip-island easily occurs. From this point, the wire deformation occurs more easily.

Japanese Patent Application Laid-Open No. Hei 10-340976 (hereinafter, referred to as a first known technique) discloses a technique in which a control plate controlling resin flow is provided at the frame side in a part adjacent to the gate of a lead frame, thereby reducing void/wire deformation/pellet shift. In the first known technique, an angled control plate is provided at the gate side of the lead frame so as to eliminate the filling difference between the top and bottom parts of the PKG.

Japanese Patent Application Laid-Open No. Hei 5-152501 (hereinafter, referred to as a second known technique) discloses a technique in which a recess part is provided in an island part opposite the recess part (eject part) of the surface of a PKG so as to easily fill a resin without reducing the space between the eject part and the island part.

As described above, in the prior art shown in FIGS. 7 to 9, the resin filling difference between the top surface of the semiconductor pellet and the inner lead edges-island is larger. A void is easily produced and the wire deformation due to the long wire easily occurs. Due to the thinner PKG, the filling difference between the chip and the chip-island easily occurs. From this point, the wire deformation easily occurs.

In the first known technique, even when the filling difference between the top and bottom parts of the PKG can be reduced to some extent, it is impossible to reduce the resin filling difference between the pellet part and the inner lead edges-island and the resin filling difference between the top and bottom parts of the wires. The type in which the inner leads are formed near the gate cannot obtain a space providing the control plate.

In the second known technique, the resin flow at the lower side of the island is only improved. The problem arising from the fact that the resin filling difference between the top surface of the semiconductor pellet and the inner lead edges-island is large cannot be solved.

BRIEF SUMMARY OF THE INVENTION

SUMMARY OF THE INVENTION

A semiconductor device of the present invention has an island; a semiconductor pellet fixed onto the island; many inner leads extended to the island; a resin sealing the island, semiconductor pellet and inner leads; and resin flow control plates provided between the edges of the inner leads and the island.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 is a diagram showing a semiconductor device of an embodiment of the present invention in the state that a semiconductor pellet is fixed onto a lead frame and the electrodes of the semiconductor pellet and the edge parts of inner leads are connected by bonding wires in which

FIG. 2 is a diagram showing the inner leads of the lead frame and their peripheral parts of the embodiment of the present invention in which

FIG. 3 is a plan view showing resin flow control plates (flow separators) of the embodiment of the present invention in which

FIG. 7 is a diagram showing a prior art semiconductor device in the state that a semiconductor pellet is fixed onto a lead frame and the electrodes of the semiconductor pellet and the edge parts of inner leads are connected by bonding wires in which

DETAILED DESCRIPTION OF THE INVENTION

Figure 1A:
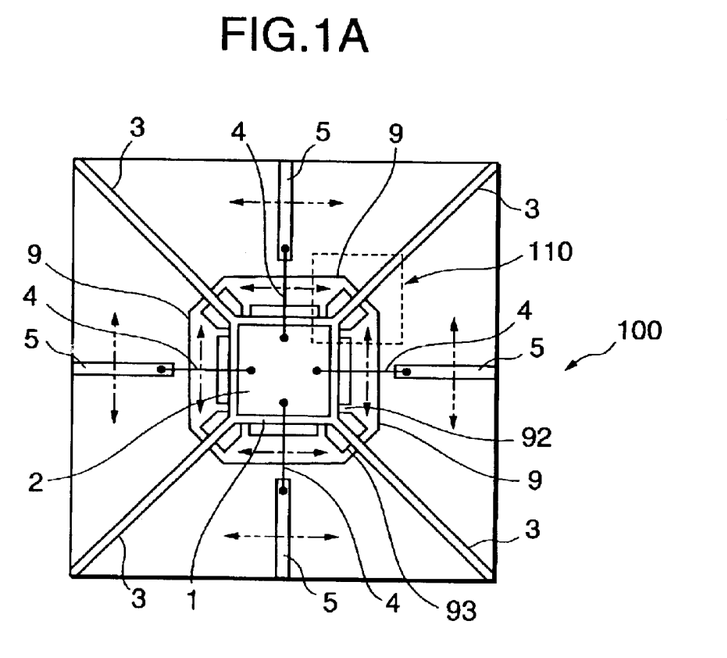
FIG. 1A is a plan view and FIG. 1B is a plan view enlarging a part 110 of FIG. 1A.
Figure 1B:
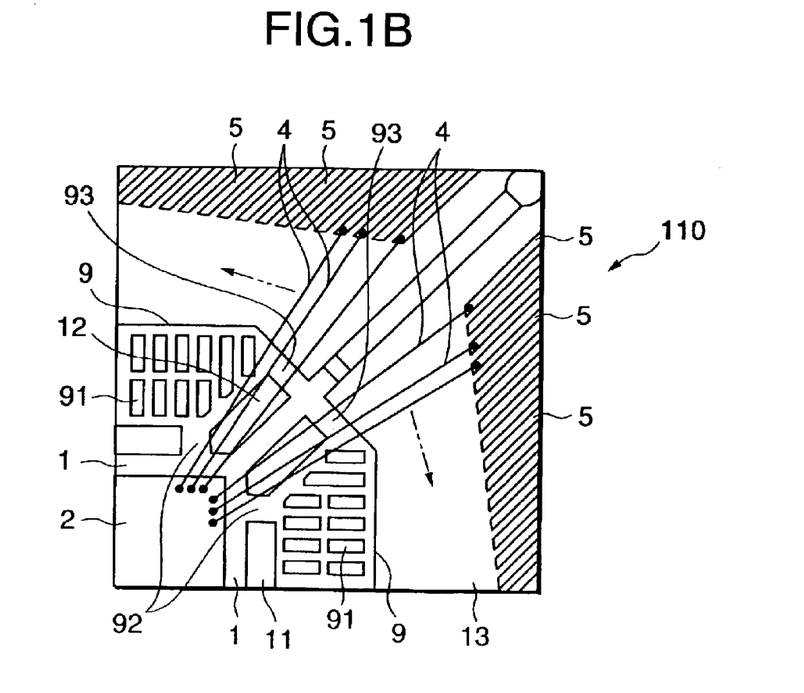

The present invention will be described below with reference to the drawings. FIG. 1 is a diagram showing a semiconductor device of an embodiment of the present invention in the state that a semiconductor pellet is fixed onto a lead frame and the electrodes of the semiconductor pellet and the edge parts of inner leads are connected by bonding wires in which FIG. 1A is a plan view and FIG. 1B is an enlarged plan view enlarging a part 110 indicated by the dotted line of FIG. 1A. Other three hanger leads and their peripheral parts have the same structure.

Figure 2A:
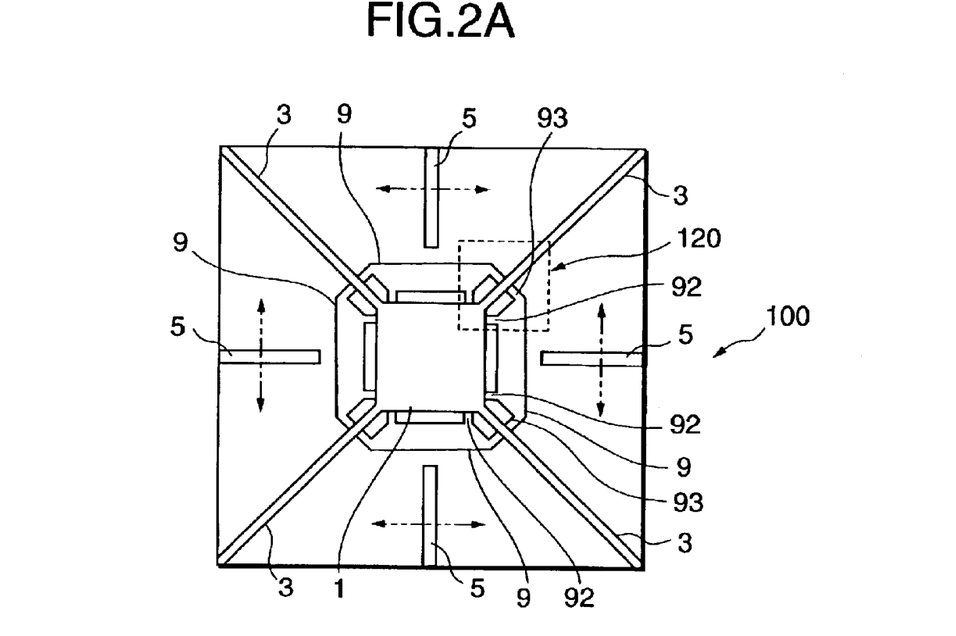
FIG. 2A is a plan view and FIG. 2B is a plan view enlarging a part 120 of FIG. 2A.
Figure 2B:
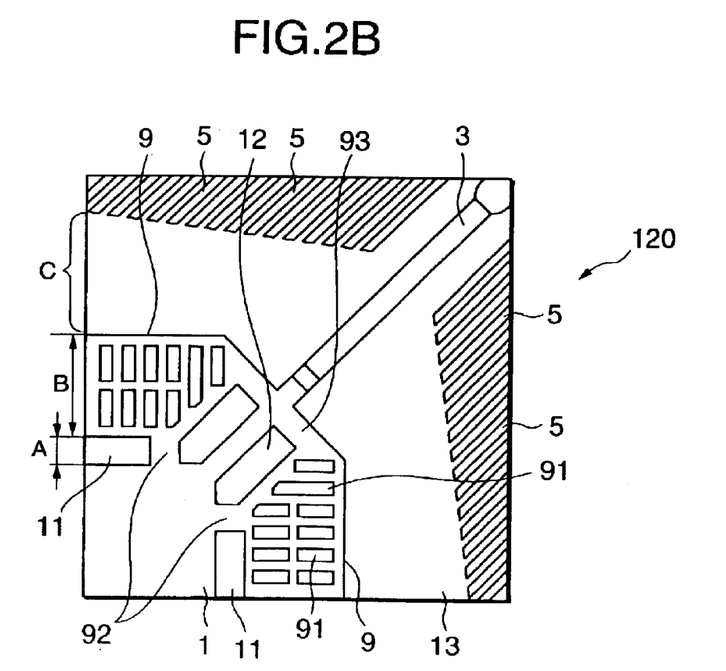

FIG. 2 is a diagram showing the inner leads of the lead frame and their peripheral parts of the embodiment of the present invention in which FIG. 2A is a plan view and FIG. 2B is an enlarged plan view enlarging a part 120 indicated by the dotted line of FIG. 2A. Other three hanger leads and their peripheral parts have the same structure.

In the drawings, the square parts of a square planar-shaped island 1 fixing and mounting a semiconductor pellet 2 are supported by four hanger leads 3. Inner leads 5 of a lead frame 100 are extended in the island direction. As indicated by the phantom line arrows, the many inner leads 5 are arrayed at a fixed pitch at each side of the island 1 and surround the island 1. The edge parts of most of the inner leads 5 and the electrodes of the semiconductor pellet 2 are connected by bonding wires 4. As indicated by the phantom line arrows, the arrayed bonding wires 4 also surround the island 1.

In this embodiment, at both sides of the four hanger leads 3, the inner lead 5 closest to the hanger lead 3 is connected to the electrode by the bonding wire 4. The inner lead 5 which is the second-closest to the hanger lead 3 is a dummy lead not connected to the bonding wire 4. The inner lead 5 closest to the hanger lead 3 in which wire deformation in the horizontal direction is most likely to occur causes no short-circuit accident when the wire deformation occurs.

In this embodiment, the inner leads 5 have their edge part having a lead width of 0.10 mm and are arrayed at a pitch of 0.20 mm. The pitch between the hanger lead 3 and the inner lead 5 is 0.10 to 0.20 mm.

The bonding wires 4 made of a gold wire having a wire diameter of 28 μm are provided in a loop at a height of about 0.20 mm from the surface of the semiconductor pellet to connect the edge parts as the bonding parts of the inner leads and the electrodes of the semiconductor pellet.

As shown in FIGS. 1 and 2, resin flow control plates (flow separators) 9 of the present invention are provided between the edges of the inner leads 5 and the island 1. The four resin flow control plates 9 are arranged to be opposite at the sides of the island to surround the island.

Each of the resin flow control plates is supported on the island 1 by a pair of first support parts 92 and is supported on the hanger leads 3 by a pair of second support parts 93.

The resin flow control plate 9 including the first and second support parts forming part of the lead frame is formed integrally with the island 1, the hanger lead 3, the inner lead 5 and an outer lead 8 (FIG. 6), for example, by a Cu plate having a plate thickness of 0.15 mm.

A space 11 between the resin flow control plate 9 and the island must be a space to flow a resin into the top and bottom parts. Size A in the island direction is 0.3 mm in the embodiment, preferably, 0.1 to 0.7 mm. This is similar in a space 12 between the resin flow control plate and the hanger lead.

Size B of the resin flow control plate 9 in the island direction is 1.2 mm in the embodiment. When the average value of a space 13 between the resin flow control plate and the inner lead is C, B is preferably about half of A+B+C.

Figure 3A:
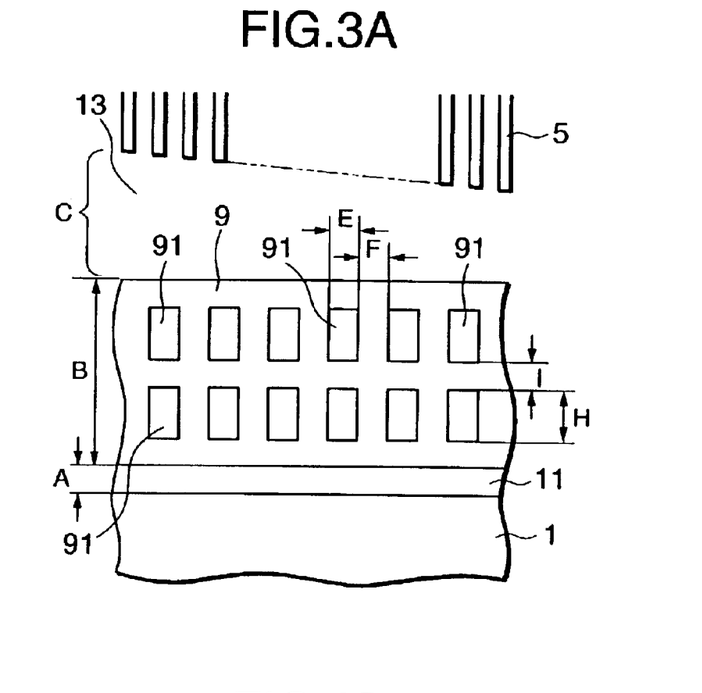
FIG. 3A shows that their through holes are square and FIG. 3B shows that their through holes are circular.
Figure 3B:
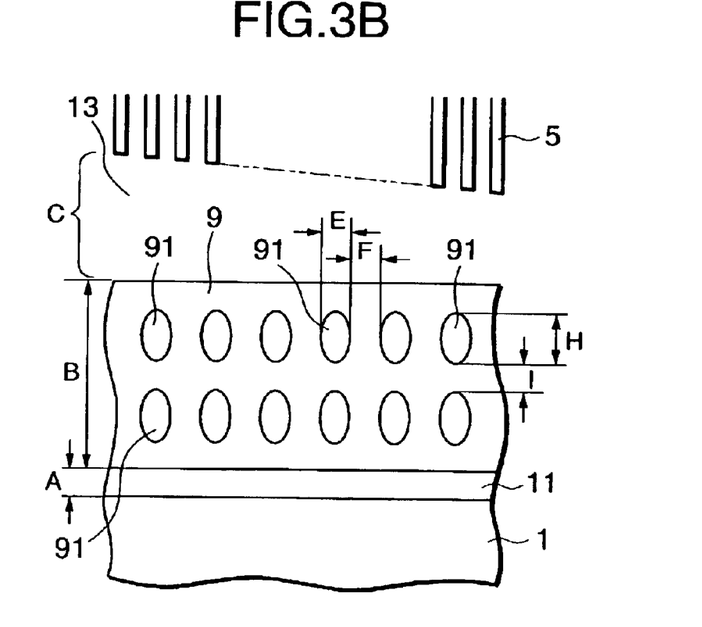

Referring to FIG. 3, through holes 91 formed in the resin flow control plate (flow separator) 9 will be described. In FIG. 3A, the though holes 91 are square so as to be illustrated as having a rectangular shape. In FIG. 3B, the through holes 91 are circular so as to be illustrated as having an elliptical shape.

In the direction perpendicular to the outer side of the island 1, the though hole 91 has a size of H and a pitch size of I. I/H is not so important and is determined by the width size B. As shown in FIGS. 1 and 2, one though hole changing H is arrayed near the hanger pin.

The through hole 91 in the direction parallel with the outer side of the island 1 has a size of E and a pitch size of F. F/E is important. When E is too large, the effect of the flow separator is lost. The suitable range of E is 0.1 to 0.7 mm. E is 0.2 mm in the embodiment. The suitable range of F is 0.1 to 0.5 mm. F is 0.2 mm in the embodiment. In the part arraying one through hole changing H near the hanger pin, the through hole is arrayed by the same values of E and F as those of other parts, as shown in FIGS. 1 and 2.

Figure 4A:
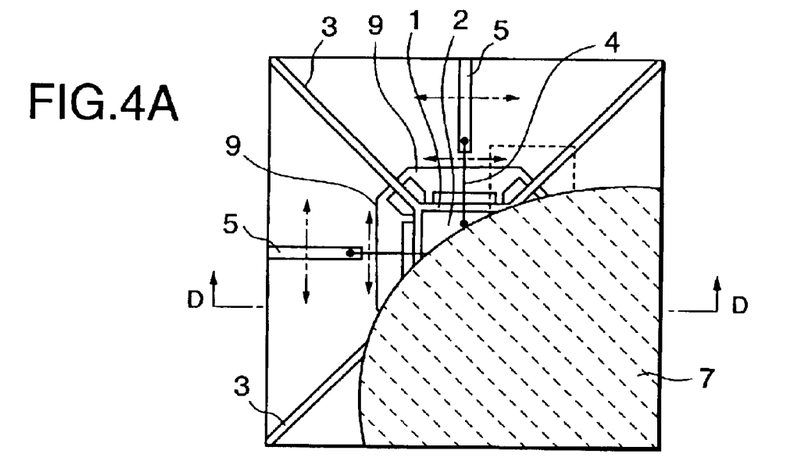
FIGS. 4A–4C are plan views sequentially showing a resin flow of the embodiment of the present invention.
Figure 4B:
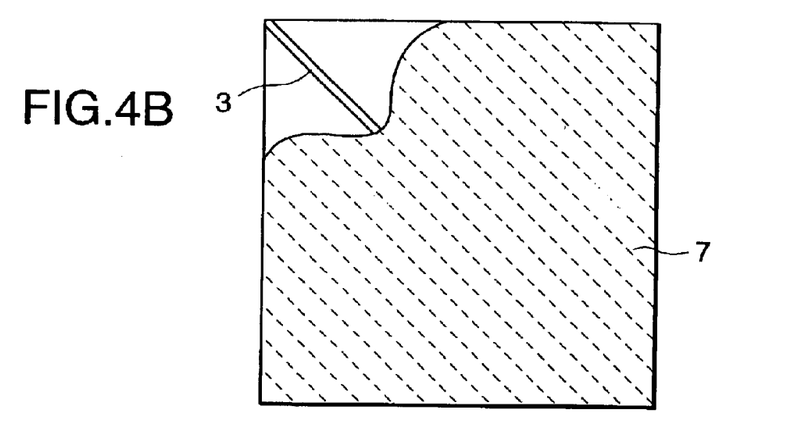
Figure 4C:
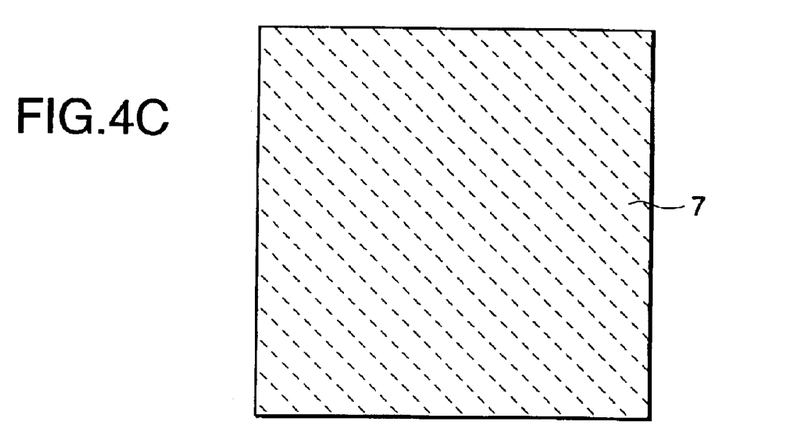

FIG. 4 shows the state that the semiconductor pellet 2 is mounted on the lead frame having the resin flow control plates 9, the edge parts of the inner leads 5 and the electrodes of the semiconductor plate are connected by the bonding wires 4, and an epoxy resin having a viscosity of 10 Pa·s is flowed for molding.

Figure 5:
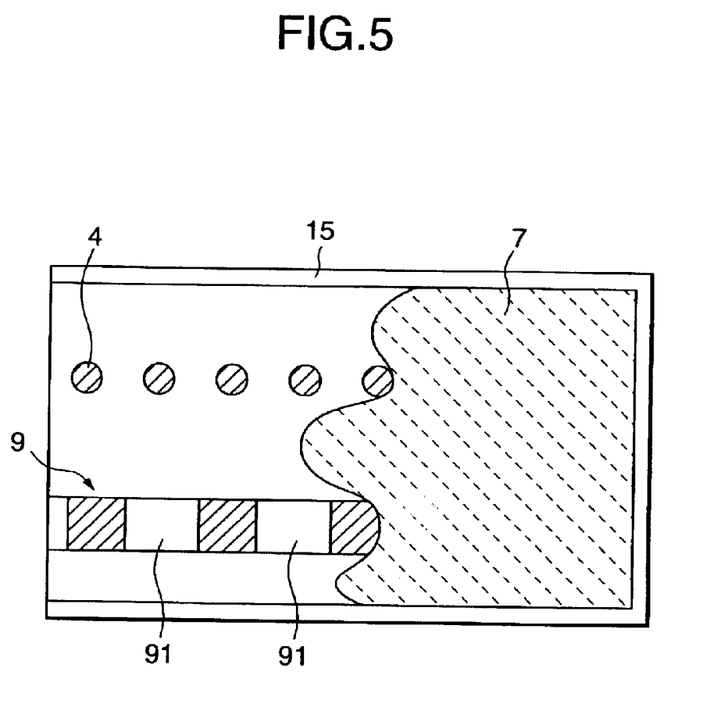
FIG. 5 is a cross-sectional view enlarging D—D part of FIG. 4A.

In the present invention, the resin flow control plates are provided between the edges of the inner leads and the island. The resin is filled first into this part in a fan shape (FIG. 5A). No air bubbles occur on the pellet during the filling (FIG. 5B). After completion of the resin filling to harden the resin, no voids as cracks and gaps occur (FIG. 5C).

As shown in FIG. 5 as a cross-sectional view enlarging D—D of FIG. 4A, in the mold 15, the resin flow control plates (flow separators) 9 exist in the lower direction of the bonding wires 4. The resin filling difference between the upper and lower directions of the bonding wires is smaller. The resin movement in the upper and lower directions of the bonding wires is small to reduce the wire deformation.

Figure 6:
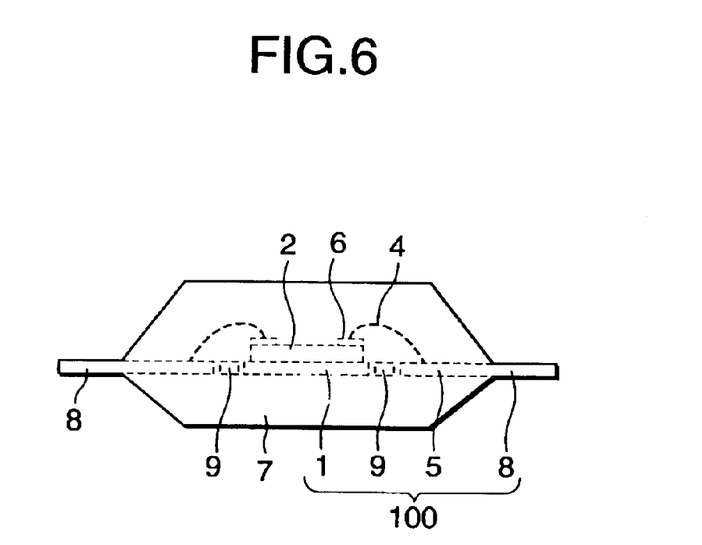
FIG. 6 is a side view schematically showing the semiconductor device of the embodiment of the present invention.

FIG. 6 shows the semiconductor device obtained from FIGS. 1 to 5. The lead frame 100 made of a Cu alloy plate having a plate thickness of 0.15 mm has the inner lead 5, the island 1, the outer lead 8 and the resin flow control plate 9. An electrode 6 of the semiconductor pellet 2 fixed and mounted onto the island 1 and the edge part of the inner lead 5 are connected by the bonding wire 4, and the outer lead 8 is led. The form is sealed with a sealing resin 7, and then, the unnecessary part of the lead frame is cut and removed. The semiconductor device of the embodiment of the present invention can be thus obtained.

As described above, according to the present invention, the resin flow control plates (flow separators) controlling the resin filling exist between the edges of the inner leads and the island in the lead frame state. The resin filling difference between the pellet and the inner leads-island can be suppressed. Disadvantageous voids in the sealing resin can be reduced.

The existence of the resin flow control plates can reduce the filling difference between the upper and lower directions of the bonding wires. Disadvantageous wire deformation can be reduced.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
   an island;
   a semiconductor pellet fixed onto said island;
   a plurality of inner leads extended to said island;
   a resin sealing said island, semiconductor pellet and inner leads; and
   a plurality of resin flow control plates provided between the edges of said inner leads and said islands,
   wherein in each resin flow control plate is arrayed a plurality of through holes.

2. The semiconductor device according to claim 1, wherein said island is supported by hanger leads, and said resin flow control plates are supported by said island and said hanger leads.

3. The semiconductor device according to claim 1, wherein said resin flow control plates are provided to surround said island.

4. The semiconductor device according to claim 1, wherein said island is square, and the four corners thereof are supported by the hanger leads.

5. The semiconductor device according to claim 4, wherein said resin flow control plates are supported by said island and said hanger leads and are formed to be opposite at the outer peripheral sides of said island.

6. The semiconductor device according to claim 1, wherein said plurality of through holes of each resin flow control plate are arrayed in at least a direction parallel to an outer peripheral side of said island adjacent to the respective resin flow control plate.

7. The semiconductor device according to claim 6, wherein for each resin flow control plate, each through hole of said plurality of through holes has a width in a range of 0.1 to 0.7 mm and a pitch in a range of 0.1 to 0.5 mm, in the direction parallel to the respective outer peripheral side of said island.

8. The semiconductor device according to claim 1, wherein said through holes are square, and each resin flow control plate is lattice-shaped.

9. The semiconductor device according to claim 1, wherein said though holes are circular.

10. The semiconductor device according to claim 1, wherein bonding wires connecting the edge parts of said inner leads and electrodes of said semiconductor pellet are provided to be extended on said resin flow control plates.

11. A semiconductor device comprising:
    an island;
    a plurality of inner leads extended to said island; and
    a plurality of resin flow control plates provided between the edges of said inner leads and said island,
    wherein in each resin flow control plate is arrayed a plurality of through holes.

12. The semiconductor device according to claim 11, wherein said island is supported by hanger leads, said resin flow control plates are supported by said island and said hanger leads, and said island, hanger leads and resin flow control plates are integrally formed.

13. The semiconductor device according to claim 11, wherein said resin flow control plates are provided to surround said island.

14. The semiconductor device according to claim 13, wherein said island is square, the four corners thereof are supported by the hanger leads, said resin flow control plates are supported by said island and said hanger leads, and said island, hanger leads and resin flow control plates are formed integrally.

15. The semiconductor device according to claim 14, wherein said resin flow control plates are formed to be opposite at the outer peripheral sides of said island.

16. The semiconductor device according to claim 11, wherein said through holes are square, and each resin flow control plate is lattice-shaped.

17. The semiconductor device according to claim 11, wherein said through holes are circular.

18. The semiconductor device according to claim 11, wherein said plurality of through holes of each resin flow control plate are arrayed in at least a direction parallel to an outer peripheral side of said island adjacent to the respective resin flow control plate.

19. The semiconductor device according to claim 18, wherein for each resin flow control plate, each through hole of said plurality of through holes has a width in a range of 0.1 to 0.7 mm and a pitch in a range of 0.1 to 0.5 mm, in the direction parallel to the respective outer peripheral side of said island.

* * * * *